(12) United States Patent
Kameta et al.

(10) Patent No.: US 9,998,093 B2
(45) Date of Patent: Jun. 12, 2018

(54) RESONATOR DEVICE, ELECTRONIC APPARATUS, AND MOVING OBJECT

(71) Applicant: Seiko Epson Corporation, Tokyo (JP)

(72) Inventors: Takahiro Kameta, Okaya (JP); Masayuki Oto, Okaya (JP); Kazuyuki Nakasendo, Shiojiri (JP)

(73) Assignee: Seiko Epson Corporation (JP)

( * ) Notice: Subject to any disclaimer, the term of this patent is extended or adjusted under 35 U.S.C. 154(b) by 455 days.

(21) Appl. No.: 14/854,581

(22) Filed: Sep. 15, 2015

(65) Prior Publication Data
US 2016/0079954 A1    Mar. 17, 2016

(30) Foreign Application Priority Data

Sep. 16, 2014 (JP) ................................. 2014-187356
Jul. 29, 2015 (JP) ................................. 2015-149338

(51) Int. Cl.
*H03H 9/02* (2006.01)
*H03H 9/17* (2006.01)
*H03H 9/05* (2006.01)
*G01C 19/5733* (2012.01)

(52) U.S. Cl.
CPC ........... *H03H 9/17* (2013.01); *G01C 19/5733* (2013.01); *H03H 9/02133* (2013.01); *H03H 9/0509* (2013.01)

(58) Field of Classification Search
CPC ...... H03H 9/17; H03H 9/02135; H03H 9/509; G01C 19/5733
See application file for complete search history.

(56) References Cited

U.S. PATENT DOCUMENTS 5,396,797 A * 3/1995 Hulsing, II ........... G01P 15/097
                                                    73/504.04
5,635,639 A * 6/1997 Greiff ................ G01C 19/5719
                                                    73/504.04

FOREIGN PATENT DOCUMENTS

JP        2014-010045 A      1/2014

* cited by examiner

*Primary Examiner* — Thomas Dougherty
*Assistant Examiner* — Karen B Addison
(74) *Attorney, Agent, or Firm* — Harness, Dickey & Pierce, P.L.C.

(57) ABSTRACT

A resonator device includes a base including a fixed section and a movable section connected to the fixed section, a resonator element including a first base section, a second base section, and a vibration arm, one end of which is connected to the first base section and the other end of which is connected to the second base section, the first base section being fixed to the fixed section and the second base section being fixed to the movable section, a weight section connected onto the movable section, and a stress relaxing section provided between a connection region of the weight section and the vibration arm.

15 Claims, 10 Drawing Sheets

RESONATOR DEVICE, ELECTRONIC APPARATUS, AND MOVING OBJECT

BACKGROUND

1. Technical Field

The present invention relates to a resonator device and an electronic apparatus and a moving object including the resonator device.

2. Related Art

As a device that detects physical quantities such as acceleration, angular velocity, and a posture of an object, there has been known a physical-quantity detection device that detects physical quantities using a piezoelectric vibrator or the like as a physical-quantity detection element. The physical-quantity detection device is configured to detect, when a resonance quantity of the physical-quantity detection element changes because force acts in a detection axis direction, from the change in the resonance frequency, the force applied to the physical-quantity detection device.

JP-A-2014-10045 (Patent Literature 1) discloses a physical-quantity detection device (a resonator device) including a cantilever (a base) including a fixed section and a movable section on both sides of the joint section and a physical-quantity detection element (a resonator element) fixed on the base across the fixed section and the movable section. In the physical-quantity detection device, in order to improve detection sensitivity, a weight is mounted on the movable section of the base.

However, in the resonator device described in Patent Literature 1, when the weight is connected onto the movable section of the base by an adhesive or the like, stress due to hardening shrinkage of the adhesive occurs, the stress reaches the resonator element, and an error component is superimposed on an output.

SUMMARY

An advantage of some aspects of the invention is to solve at least a part of the problems described above, and the invention can be implemented as the following forms or application examples.

Application Example 1

A resonator device according to this application example includes: a base including a fixed section and a movable section connected to the fixed section; a resonator element including a first base section, a second base section, and a vibration arm, one end of which is connected to the first base section and the other end of which is connected to the second base section, the first base section being fixed to the fixed section and the second base section being fixed to the movable section; a weight section connected onto the movable section; and a stress relaxing section provided between a connection region of the weight section and the vibration arm.

According to this application example, in the movable section to which the second base section of the resonator element and the weight section are joined and connected, the stress relaxing section is provided between the connection region, to which the weight section is connected, and the vibration arm. Therefore, stress caused by hardening shrinkage of a connection member to which the weight section is connected is less easily directly transmitted to a region to which the vibration arm is joined. Therefore, it is possible to reduce superimposition of an error component involved in the stress on an output such as a frequency change of the vibration arm. Therefore, it is possible to obtain the resonator device having highly accurate characteristics.

Application Example 2

In the resonator device according to the application example, the stress relaxing section may be at least one of a groove and a through-hole.

According to this application example, since the stress relaxing section is the groove or the through-hole, it is possible to easily process and manufacture the resonator device. Therefore, it is possible to obtain a low-cost resonator device.

Application Example 3

In the resonator device according to the application example, the stress relaxing section may be provided on the base.

According to this application example, since the stress relaxing section is provided on the base to which the second base section of the resonator element and the weight section are joined and connected, the stress caused by the hardening shrinkage of the connection member to which the weight section is connected is much less easily transmitted to the vibration arm through the base. Therefore, it is possible to further reduce the influence of the stress.

Application Example 4

In the resonator device according to the application example, the stress relaxing section may be provided around the second base section.

According to this application example, since the stress relaxing section is disposed around the second base section on the base to which the second base section of the resonator element and the weight section are joined and connected, the stress caused by the hardening shrinkage of the connection member to which the weight section is connected is much less easily transmitted to the vibration arm through the base. Therefore, it is possible to further reduce the influence of the stress.

Application Example 5

In the resonator device according to the application example, when a direction orthogonal to a direction in which the vibration arm extends is represented as a first direction, the length in the first direction of the stress relaxing section may be larger than the length in the first direction of the second base section.

According to this application example, since the width of the stress relaxing section is set larger than the width of the second base section, the stress caused by the hardening shrinkage of the connection member to which the weight section is connected is much less easily transmitted to the vibration arm. Therefore, it is possible to further reduce the influence of the stress.

Application Example 6

An electronic apparatus according to this application example includes the resonator device according to the application example described above.

According to this application example, it is possible to configure the electronic apparatus including the resonator device having highly accurate characteristics.

Application Example 7

A moving object according to this application example includes the resonator device according to the application example described above.

According to this application example, it is possible to configure the moving object including the resonator device having highly accurate characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention are explained in detail below with reference to the drawings. Note that, in the figures referred to below, dimensions and ratios of components are sometimes shown differently from actual dimensions and ratios of the components as appropriate in order to show the components in recognizable sizes on the drawings.

Resonator Device

First Embodiment

First, an acceleration sensor that detects acceleration in a direction crossing a principal plane of a base from a resonance frequency change of a double ended tuning fork-type resonator element is an example of a resonator device according to a first embodiment of the invention. The schematic configuration of the acceleration sensor is explained with reference to FIGS. 1 and 2.

Figure 1:
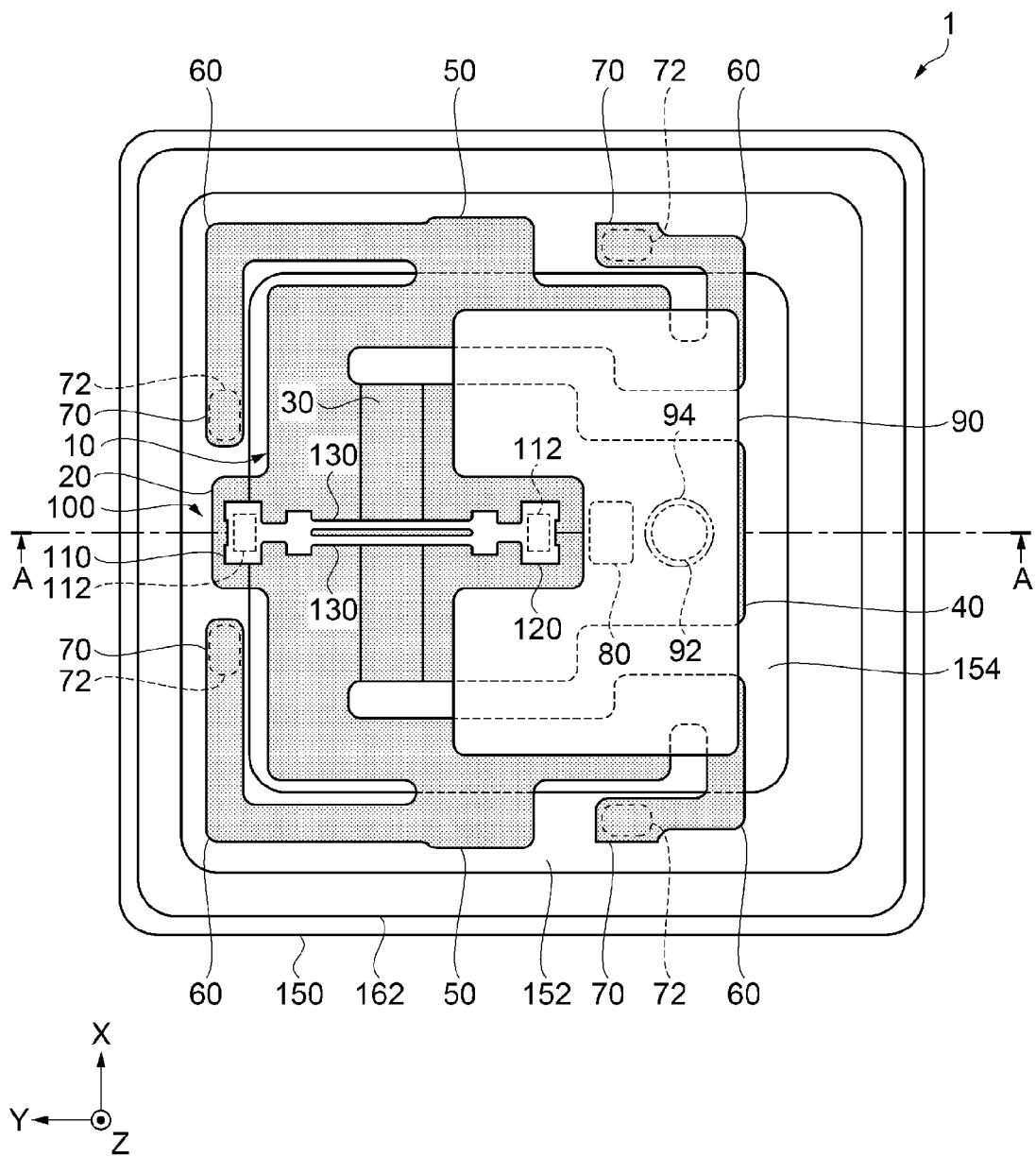
FIG. 1 is a schematic plan view of a resonator device according to a first embodiment of the invention.
Figure 2:
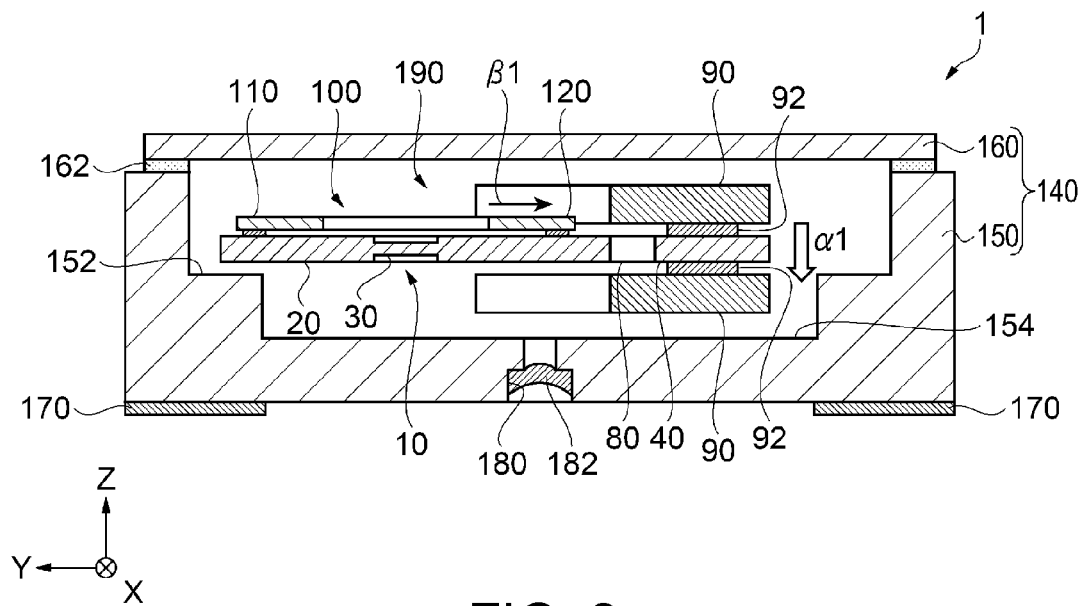
FIG. 2 is a schematic sectional view taken along line A-A in FIG. 1.

FIG. 1 is a schematic plan view of the resonator device according to the first embodiment of the invention. FIG. 2 is a schematic sectional view taken along line A-A in FIG. 1.

Note that, in FIG. 1, for convenience of explanation of the configuration of the inside of a resonator device 1, a state in which a lid 160 is removed is shown. For convenience of explanation, in the figures referred to below, an X axis, a Y axis, and a Z axis are shown as three axes orthogonal to one another. A direction along the X axis is represented as an X-axis direction, a direction along the Y axis is represented as a Y-axis direction, and a direction along the Z axis is represented as a Z-axis direction. An XY plane is referred to as principal plane. Note that the Z axis is an axis indicating a direction in which acceleration is applied.

Structure of the Resonator Device

The resonator device 1 in this embodiment includes, as shown in FIGS. 1 and 2, a base 10 including a fixed section 20, a movable section 40, and a joint section 30 provided between the fixed section 20 and the movable section 40, a resonator element 100 including a first base section 110, a second base section 120, and vibration arms 130, one end of which is connected to the first base section 110 and the other end of which is connected to the second base section 120, the first base section 110 being fixed to the fixed section 20 and the second base section 120 being fixed to the movable section 40, weight sections 90 connected onto the movable section 40, a stress relaxing section 80 provided between a connection region 94 of the weight sections 90 and the vibration arms 130, and a package 140.

Base

As shown in FIG. 2, the base 10 includes the fixed section 20 at one end and includes the movable section 40 at the other end. The base 10 includes, between the fixed section 20 and the movable section 40, the joint section 30 having thickness (length in the Z-axis direction) smaller than the thicknesses of the fixed section 20 and the movable section 40. From the fixed section 20, as shown in FIG. 1, coupling sections 50 respectively extend in a +X-axis direction and a −X-axis direction of a direction crossing a direction in which the joint section 30 is connected, that is, a first direction (the X-axis direction) crossing a direction (the Y-axis direction) in which the vibration arms 130 of the resonator element 100 extend. The coupling sections 50 extend in the X-axis direction and extend in the Y-axis direction via curved sections. From the coupling sections 50, two supporting arms 60 extend via a plurality of curved sections. Supporting sections 70 are provided at the distal end portions of the supporting arms 60.

Note that the supporting sections 70 are joined on a step section 152 of the package 140 via joining members 72. Consequently, it is possible to dispose the fixed section 20 and the movable section 40 of the base 10 separately from the package 140. It is possible to displace the movable section 40 in the Z-axis direction, which is a direction in which acceleration is applied.

Since the plurality of curved sections are provided in the supporting arms 60, it is possible to reduce the influence of thermal stress caused by a difference between coefficients of linear expansion of the base 10 and the package 140.

On the principal plane of the fixed section 20, the first base section 110 of the resonator element 100 is fixed. On the principal plane of the movable section 40, the second base section 120 of the resonator element 100 is fixed.

In the movable section 40, in a plan view of the resonator device 1 viewed from an opening side (the lid 160 side) of the package 140 (a package base 150 explained below), a fixed region of the second base section 120, the stress relaxing section 80, which is a through-hole, and the connection region 94 to which the weight sections 90 are connected are disposed along a direction (the Y-axis direction) in which the vibration arms 130 extend. The weight sections 90 are connected to the connection region 94 via connection members 92.

As the base 10, for example, a crystal substrate sliced from an ore of crystal or the like at a predetermined angle is used. By patterning the crystal substrate, the fixed section 20, the joint section 30, the movable section 40, the coupling sections 50, the supporting arms 60, the supporting sections 70, and the stress relaxing section 80 are integrally formed. As the patterning, for example, a photolithography technique and an etching technique can be used. Note that the material of the base 10 is not limited to the crystal. Glass or a semiconductor material such as silicon may be used.

Resonator Element

The configuration of the resonator element 100 is explained with reference to FIGS. 1 and 2.

The resonator element 100 includes, as shown in FIGS. 1 and 2, the first base section 110, the second base section 120, and a pair of vibration arms 130, one end of which is connected to the first base section 110 and the other end of which is connected to the second base section 120. The first base section 110 is fixed on the fixed section 20 of the base 10 via a joining member 112. The second base section 120 is fixed on the movable section 40 of the base 10 via the joining member 112. As the joining member 112 for the resonator element 100, for example, low melting point glass and an alloy film of eutectically bondable gold (Au) and tin (Sn) can be used.

In the resonator element 100 in this embodiment, for example, when the movable section 40 of the base 10 is displaced according to acceleration, stress occurs in the vibration arms 130 and a vibration frequency (a resonance frequency) of the vibration arms 130 changes. Note that, in this embodiment, the resonator element 100 is a double ended tuning fork-type resonator element including the pair of vibration arms 130, the first base section 110 and the second base section 120.

The vibration arms 130 are provided to extend between the first base section 110 and the second base section 120 along the Y-axis direction. The shape of the vibration arms 130 is, for example, a prism shape. When a driving signal is applied to excitation electrodes (not shown in the figure) provided in the vibration arms 130, the vibration arms 130 can flexurally vibrate to approach or separate from each other along the X-axis direction.

The resonator element 100 in this embodiment is formed by, for example, patterning, using the photolithography technique and the etching technique, a crystal substrate sliced from a crystal ore or the like at a predetermined angle. Consequently, it is possible to integrally form the vibration arms 130, the first base section 110, and the second base section 120.

Note that the material of the resonator element 100 is not limited to the crystal substrate. For example, piezoelectric materials such as lithium tantalate ($LiTaO_3$), lithium tetraborate ($Li_2B_4O_7$), lithium niobate ($LiNbO_3$), lead zirconate titanate (PZT), zinc oxide (ZnO), and aluminum nitride (AlN) can be used. A semiconductor material such as silicon including a piezoelectric (piezoelectric material) film of zinc oxide (ZnO), aluminum nitride (AlN), or the like can be used.

For example, an extraction electrode (not shown in the figure) is provided on the first base section 110 and the second base section 120 of the resonator element 100. The extraction electrode is electrically connected to an excitation electrode (not shown in the figure) provided in the vibration arms 130.

The extraction electrode is electrically connected to, for example, by a metal wire (not shown in the figure) of gold (Au), aluminum (Al), or the like, a connection terminal (not shown in the figure) provided on the principal plane of the base 10.

As the excitation electrode, the extraction electrode, and the connection terminal, for example, a stacked body obtained by stacking a gold (Au) layer on a chrome (Cr) layer functioning as a foundation. The excitation electrode and the extraction electrode are provided by, for example, forming a conductive layer with a sputtering method or the like and patterning the conductive layer.

Weight Section

As shown in FIG. 1, the weight sections 90 are connected to the position of the connection region 94 via the connection members 92 in plan view. As shown in FIG. 2, the weight sections 90 are provided on the principal plane in a +Z-axis direction and the principal plane in a −Z-axis direction of the movable section 40. More specifically, the weight sections 90 are connected to the respective principal planes of the movable section 40 via the connection members 92. Examples of the material of the weight sections 90 include metal such as copper (Cu) and gold (Au). As the material of the connection members 92 for the weight sections 90, for example, a thermosetting adhesive containing silicone resin can be used.

Note that, in this embodiment, two weight sections 90 are provided on the principal planes in the +Z-axis direction and the −Z-axis direction of the movable section 40. However, not only this, but one or a plurality of weight sections 90 may be provided on any one of the principal planes.

Stress Relaxing Section

The stress relaxing section 80 is provided on the base 10 and, more specifically, provided in the movable section 40 of the base 10 and disposed between the connection region 94 to which the weight sections 90 are connected and the vibration arms 130. As shown in FIG. 2, the stress relaxing section 80 is a through-hole that pierces through the movable section 40. The stress relaxing section 80 is formed simultaneously with various parts of the base 10 by patterning the movable section 40 using the photolithography technique and the etching technique.

The stress relaxing section 80 is the through-hole and is disposed between the connection region 94 and the vibration arms 130. Therefore, it is possible to make stress in the Y-axis direction caused during hardening shrinkage of the connection members 92, to which the weight sections 90 are connected, less easily transmitted to the vibration arms 130 via the second base section 120 fixed to the movable section 40. Therefore, it is possible to reduce superimposition of an error component involved in the stress caused by the hardening shrinkage of the connection members 92 on an output such as a frequency change of the vibration arms 130. It is possible to obtain the resonator device 1 having highly accurate characteristics.

Package

The package 140 includes a package base 150 including a container-like cavity 190 and the lid 160 that hermetically seals the cavity 190, which is an internal space of the package 140, in a peripheral edge portion on an opening side of the package base 150.

The base 10, to which the weight sections 90 and the resonator element 100 are fixed, is fixed via the joining members 72 by disposing the supporting sections 70 on the step section 152 of the package base 150. Therefore, as shown in FIG. 2, the weight sections 90 connected to the movable section 40 can be disposed separately from a bottom section 154 of the package base 150 and the lid 160. Therefore, when acceleration in the Z-axis direction is applied to the movable section 40, the movable section 40 is displaced in the Z-axis direction and acceleration can be detected.

The distance (the length in the Z-axis direction) between the weight section 90 and the bottom section 154 and the distance (the length in the Z-axis direction) between the weight section 90 and the lid 160 are set within a displacement amount (the length in the Z-axis direction) of the movable section 40 in terms of an allowable acceleration value. Consequently, when acceleration larger than the allowable acceleration value is applied, the bottom section 154 and the lid 160 act as stoppers. Breakage of the resonator element 100 can be prevented.

External terminals 170 used in mounting on an external member are provided on an outer bottom surface (a surface on the opposite side of a side of the bottom section 154 where the base 10 is disposed) of the package base 150. The external terminals 170 are electrically connected to internal terminals (not shown in the figure), which are provided on the side to which the base 10 is joined, via internal wires (not shown in the figure).

As the package base 150, an aluminum oxide sintered body, which is obtained by stacking and baking ceramic green sheets, crystal, glass, silicon, or the like is used.

As the lid 160, a material same as the material of the package base 150 or metal such as kovar, a 42 alloy, or a stainless steel is used. The package base 150 and the lid 160 can be fixed using a joining member 162 for joining the lid 160 such as a seam ring, low melting point glass, or an inorganic adhesive formed on the package base 150. Anodic bonding can also be used.

In the resonator device 1, after the joining of the lid 160, in a state in which the internal space (the cavity 190) of the package 140, in which the base 10 to which the weight sections 90 and the resonator element 100 are fixed is housed, is decompressed (a state with a high vacuum degree), a sealing member 182 made of an alloy of gold (Au) and germanium (Ge), solder, or the like is disposed in a sealing hole 180 provided in the bottom section 154 of the package base 150. The sealing member 182 is heated and melted and then solidified. Consequently, the internal space (the cavity 190) of the package 140 is hermetically sealed.

Note that the internal space (the cavity 190) of the package 140 may be filled with an inert gas such nitrogen, helium, or argon.

Operation of the Resonator Device

The operation of the resonator device 1 is explained.

As shown in FIG. 2, in the resonator device 1, when acceleration α1 is applied in the −Z-axis direction, the movable section 40 is displaced in the −Z-axis direction with the joint section 30 as a fulcrum according to the acceleration α1. Consequently, in the resonator element 100, force in an arrow β1 direction is applied to the second base section 120 along the Y axis. Tension for separating the first base section 110 and the second base section 120 from each other is generated. Tensile stress in the arrow β1 direction is generated in the vibration arms 130. Therefore, the vibration frequency (the resonance frequency) of the vibration arms 130 increases.

On the other hand, when the acceleration α1 is applied in the +Z-axis direction, the movable section 40 is displaced in the +Z-axis direction with the joint section 30 as a fulcrum according to the acceleration α1. Consequently, force in a direction opposite to the direction of the arrow β1 is applied to the resonator element 100. A compression force for bringing the first base section 110 and the second base section 120 close to each other is generated. Compression stress in the direction opposite to the direction of the arrow β1 is generated in the vibration arms 130. Therefore, the vibration frequency (the resonance frequency) of the vibration arms 130 decreases.

In the resonator device 1, when a driving signal is applied to the excitation electrode of the resonator element 100 through the external terminal 170, an internal terminal (not shown in the figure), an internal wire (not shown in the figure), or the like of the package 140, the vibration arms 130 of the resonator element 100 vibrate (resonate) at a predetermined frequency. The resonator device 1 can detect the acceleration α1 by outputting, as an output signal, a resonance frequency of the resonator element 100 that changes according to the applied acceleration α1.

Note that, in this embodiment, the example is explained in which the element of a so-called double ended tuning fork structure is used as the resonator element 100. However, a form of the resonator element 100 is not particularly limited as long as the vibration frequency changes on the basis of the displacement of the movable section 40 and physical quantities can be detected.

Note that the resonator device 1 in this embodiment can be applied as the acceleration sensor that detects acceleration. The resonator device 1 can also be applied as an inertial sensor, a vibration sensor (a vibrometer), a gravity sensor (a gravimeter), and an inclination sensor (a clinometer).

According to the first embodiment, effects explained below are obtained.

In the resonator device 1 in this embodiment, in the movable section 40 to which the second base section 120 of the resonator element 100 and the weight section 90 are fixed, the stress relaxing section 80 is provided between the connection region 94, to which the weight section 90 is connected, and the vibration arms 130. Therefore, since stress caused by hardening shrinkage of the connection members 92 to which the weight sections 90 are connected is less easily transmitted to the vibration arms 130, it is possible to reduce superimposition of an error component involved in stress on an output such as a frequency change of the vibration arms 130. Therefore, it is possible to obtain the resonator device 1 having highly accurate characteristics.

Second Embodiment

A resonator device 1a according to a second embodiment of the invention is explained with reference to FIGS. 3 and 4.

Figure 3:
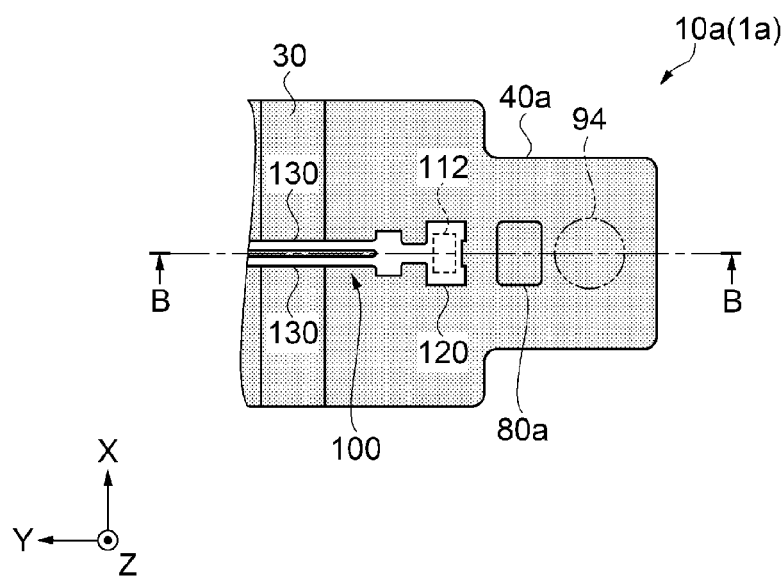
FIG. 3 is a schematic plan view of a movable section of a resonator device according to a second embodiment of the invention.

FIG. 3 is a schematic plan view showing the schematic configuration of a movable section of the resonator device according to the second embodiment of the invention. FIG. 4 is a schematic sectional view taken along line B-B in FIG. 3.

A movable section 40a of a base 10a according to the second embodiment is different from the movable section 40 of the base 10 explained in the first embodiment in the configuration of the stress relaxing section 80.

The other components and the like are substantially the same as those of the movable section 40 explained in the first embodiment. Therefore, the movable section 40a is explained with the same components denoted by the same reference numerals and signs and explanation of the components partially omitted.

Figure 4:
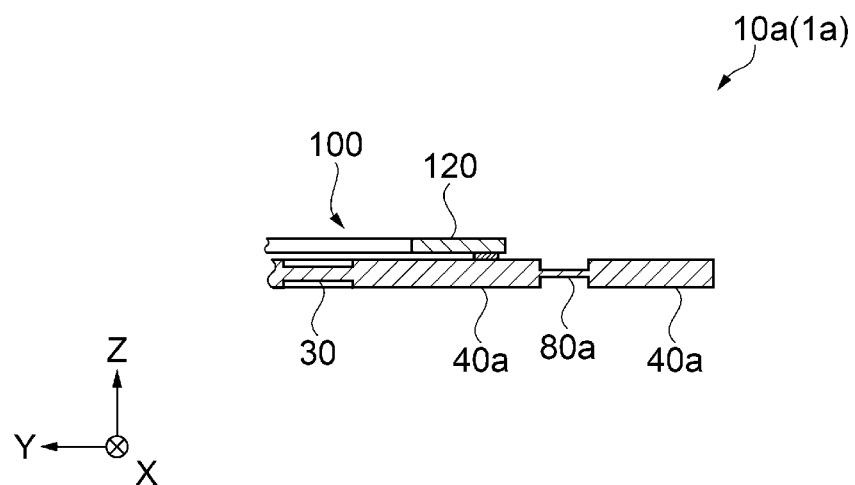
FIG. 4 is a schematic sectional view taken along line B-B in FIG. 3.

In the movable section 40a in this embodiment, as shown in FIG. 4, a stress relaxing section 80a disposed between a position where the second base section 120 of the resonator element 100 is fixed and the connection region 94 to which the weight sections 90 are connected is configured by two bottomed grooves disposed in positions respectively opposed to the principal plane in the +Z-axis direction and the principal plane in the −Z-axis direction of the movable section 40a. Note that, in this embodiment, the two bottomed grooves are provided on the principal planes in the +Z-axis direction and the −Z-axis direction of the movable section 40a. However, not only this, but one or a plurality of bottomed grooves may be provided on one of the principal planes.

By adopting such a configuration, since the stress relaxing section 80a has thickness (length in the Z-axis direction) smaller than the thickness of the movable section 40a. Therefore, as in the first embodiment, it is possible to make the stress caused by the hardening shrinkage of the connection member less easily transmitted to the vibration arms 130. The grooves forming the stress relaxing section 80a can be easily formed by patterning the movable section 40a using the photolithography technique and the etching technique. Therefore, it is possible to obtain a low-cost resonator device 1a.

Third Embodiment

A resonator device 1b according to a third embodiment of the invention is explained with reference to FIG. 5.

Figure 5:
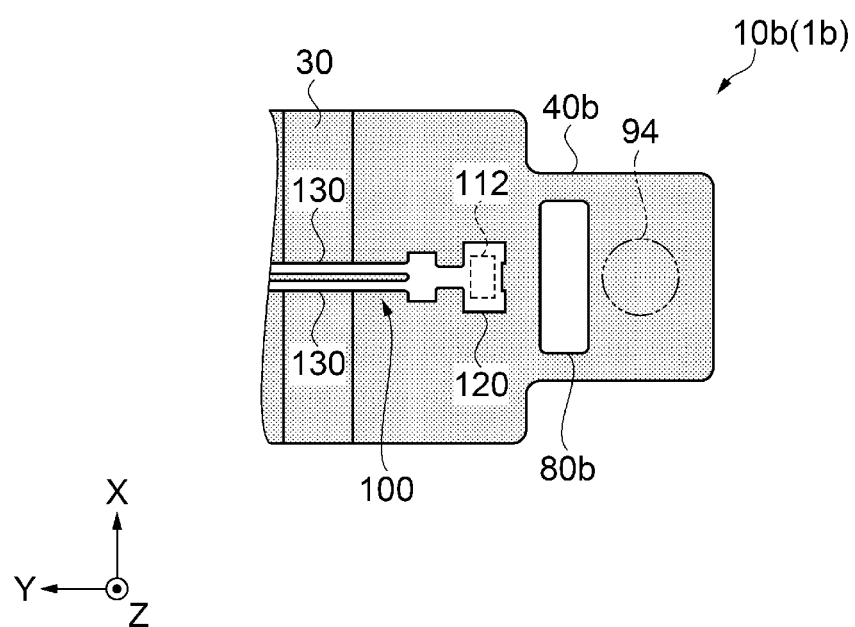
FIG. 5 is a schematic plan view of a movable section of a resonator device according to a third embodiment of the invention.

FIG. 5 is a schematic plan view showing the schematic configuration of a movable section of the resonator device according to the third embodiment of the invention.

A movable section 40b of a base 10b according to the third embodiment is different from the movable section 40 of the base 10 explained in the first embodiment in the size of the shape of the stress relaxing section 80.

The other components and the like are substantially the same as those of the movable section 40 explained in the first embodiment. Therefore, the movable section 40b is explained with the same components denoted by the same reference numerals and signs and explanation of the components partially omitted.

In the movable section 40b in this embodiment, a stress relaxing section 80b is a through-hole. The stress relaxing section 80b is formed in a shape, the length of which in the first direction (the X-axis direction) crossing a direction in which the vibration arms 130 of the resonator element 100 extend is larger than the length in the first direction (the X-axis direction) of the second base section 120.

By adopting such a configuration, the length of the connection of the connection region 94 and the second base section 120 can be increased. Therefore, as in the first embodiment, it is possible to make the stress caused by the hardening shrinkage of the connection member less easily transmitted to the vibration arms 130. It is possible to further reduce the influence of the stress.

Note that, concerning the shape of the stress relaxing section 80b, as long as the strength of the movable section 40b can be sufficiently secured, as the length in the first direction (the X-axis direction) crossing the direction in which the vibration arms 130 of the resonator element 100 extend is further increased and the width of beam-like sections formed on both sides of the stress relaxing section 80b is further narrowed, it is possible to make the stress caused by the hardening shrinkage of the joining member much less easily transmitted to the vibration arms 130.

In the shape of the stress relaxing section 80b in this embodiment, naturally, the stress relaxing section 80b may be formed by bottomed grooves like the stress relaxing section 80a in the second embodiment.

Fourth Embodiment

A resonator device 1c according to a fourth embodiment of the invention is explained with reference to FIG. 6.

Figure 6:
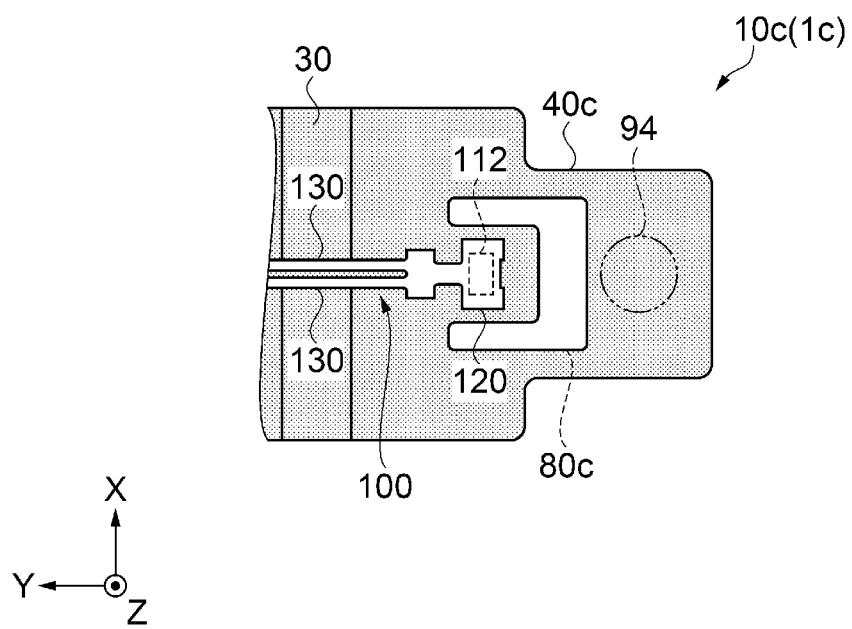
FIG. 6 is a schematic plan view of a movable section of a resonator device according to a fourth embodiment of the invention.

FIG. 6 is a schematic plan view showing the schematic configuration of a movable section of the resonator device according to the fourth embodiment of the invention.

A movable section 40c of a base 10c according to the fourth embodiment is different from the movable section 40 of the base 10 explained in the first embodiment in the shape of the stress relaxing section 80.

The other components and the like are substantially the same as those of the movable section 40 explained in the first embodiment. Therefore, the movable section 40c is explained with the same components denoted by the same reference numerals and signs and explanation of the components partially omitted.

In the movable section 40c in this embodiment, a stress relaxing section 80c is a through-hole. The stress relaxing section 80c is formed in a shape, the length of which in the first direction (the X-axis direction) crossing the direction in which the vibration arms 130 of the resonator element 100 extend is larger than the length in the first direction (the X-axis direction) of the second base section 120. The stress relaxing section 80c is provided around the second base section 120 to extend in the +Y-axis direction from both end portions in the first direction (the X-axis direction) and surround the second base section 120 in three directions, i.e., the +X-axis direction, the −X-axis direction, and a −Y-axis direction.

By adopting such a configuration, the length of the connection of the connection region 94 and the second base section 120 can be further increased. Therefore, as in the first embodiment, it is possible to make the stress caused by the hardening shrinkage of the connection member less easily transmitted to the vibration arms 130. It is possible to further reduce the influence of the stress.

Fifth Embodiment

A resonator device 1*d* according to a fifth embodiment of the invention is explained with reference to FIG. 7.

Figure 7:
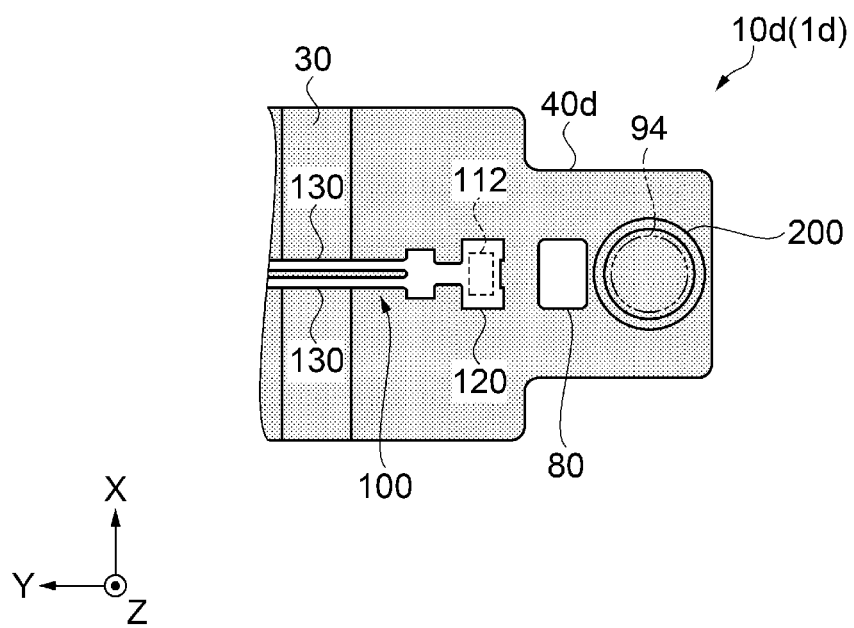
FIG. 7 is a schematic plan view of a movable section of a resonator device according to a fifth embodiment of the invention.

FIG. 7 is a schematic plan view showing the schematic configuration of a movable section of the resonator device according to the fifth embodiment of the invention.

A movable section 40*d* of a base 10*d* according to the fifth embodiment is different from the movable section 40 of the base 10 explained in the first embodiment in that a protrusion section 200 is provided around the connection region 94.

The other components and the like are substantially the same as those of the movable section 40 explained in the first embodiment. Therefore, the movable section 40*d* is explained with the same components denoted by the same reference numerals and signs and explanation of the components partially omitted.

In the movable section 40*d* in this embodiment, the protrusion section 200 having a shape surrounding the connection region 94 is disposed around the connection region 94 on the principal plane of the movable section 40*d*.

By adopting such a configuration, the connection member can be prevented from protruding from the connection region 94. A connection area of the connection region 94 can be kept fixed. Therefore, it is possible to reduce stress fluctuation and connection strength fluctuation involved in the hardening shrinkage of the connection member due to size fluctuation of the connection area.

Modification 1 and Modification 2

Resonator devices 1*d*1 and 1*d*2 according to modifications of the fifth embodiment of the invention are explained with reference to FIGS. 8 and 9.

Figure 8:
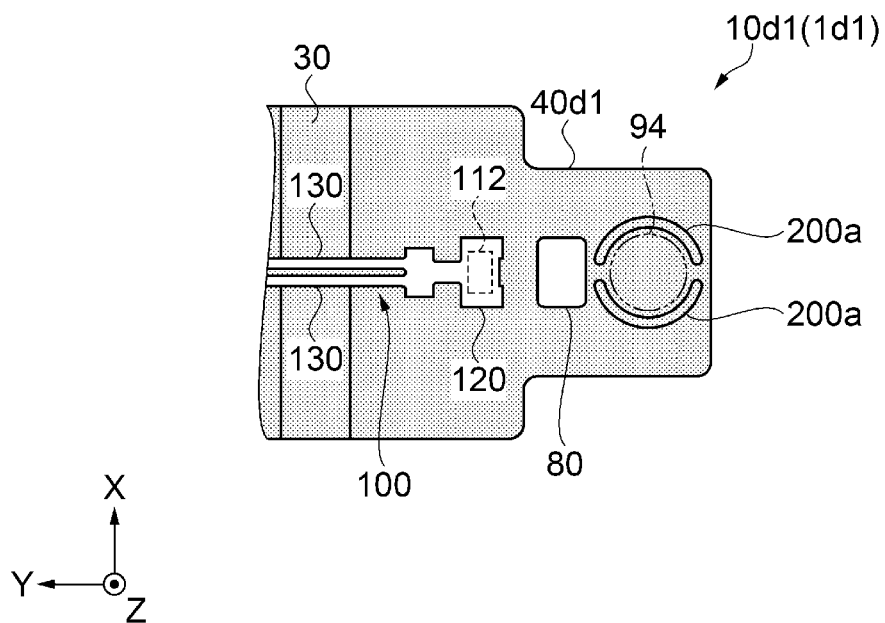
FIG. 8 is a schematic plan view of a movable section of a resonator device according to a modification 1 of the fifth embodiment of the invention.
Figure 9:
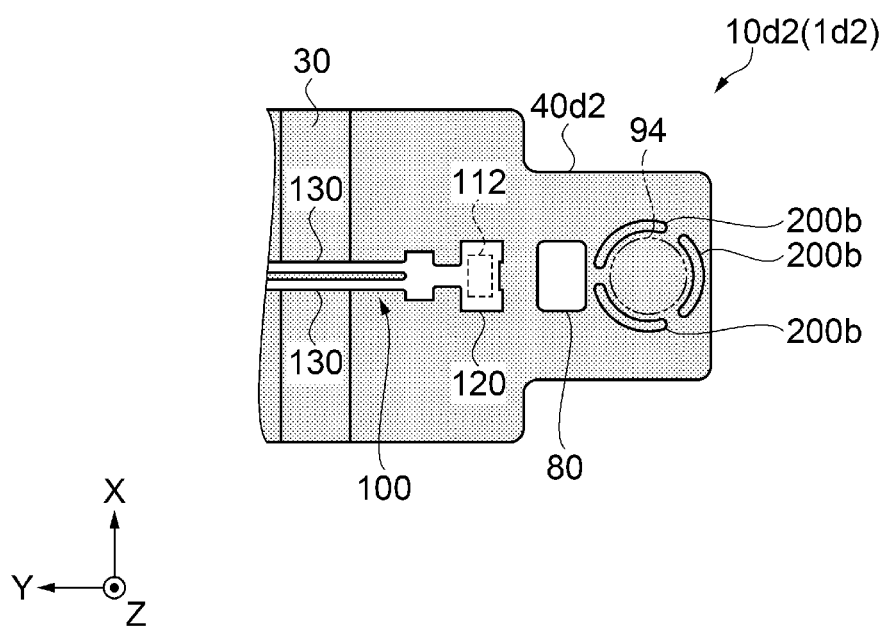
FIG. 9 is a schematic plan view of a movable section of a resonator device according to a modification 2 of the fifth embodiment of the invention.

FIG. 8 is a schematic plan view showing the schematic configuration of a movable section of a resonator device according to a modification 1 of the fifth embodiment. FIG. 9 is a schematic plan view showing the schematic configuration of a movable section of a resonator device according to a modification 2 of the fifth embodiment.

Movable sections 40*d*1 and 40*d*2 of bases 10*d*1 and 10*d*2 according to the modification 1 and the modification 2 are different from the movable section 40*d* explained in the fifth embodiment in the shape of the protrusion section 200.

The other components and the like are substantially the same as those of the movable section 40*d* explained in the fifth embodiment. Therefore, the movable sections 40*d*1 and 40*d*2 are explained with the same components denoted by the same reference numerals and signs and explanation of the components partially omitted.

In the movable sections 40*d*1 and 40*d*2 in the modification 1 and the modification 2, a plurality of protrusion sections 200*a* and 200*b* are disposed around the connection region 94 on the principal planes of the movable sections 40*d*1 and 40*d*2. In the movable section 40*d*1 in the modification 1, two protrusion sections 200*a* are disposed to surround the connection region 94. In the movable section 40*d*2 in the modification 2, three protrusion sections 200*b* are disposed to surround the connection region 94.

By adopting such a configuration, as in the fifth embodiment, the connection member can be prevented from protruding from the connection region 94. A connection area of the connection region 94 can be kept fixed. Therefore, it is possible to reduce stress fluctuation and connection strength fluctuation involved in the hardening shrinkage of the connection member due to size fluctuation of the connection area.

Sixth Embodiment

A resonator device 1*e* according to a sixth embodiment of the invention is explained with reference to FIG. 10.

Figure 10:
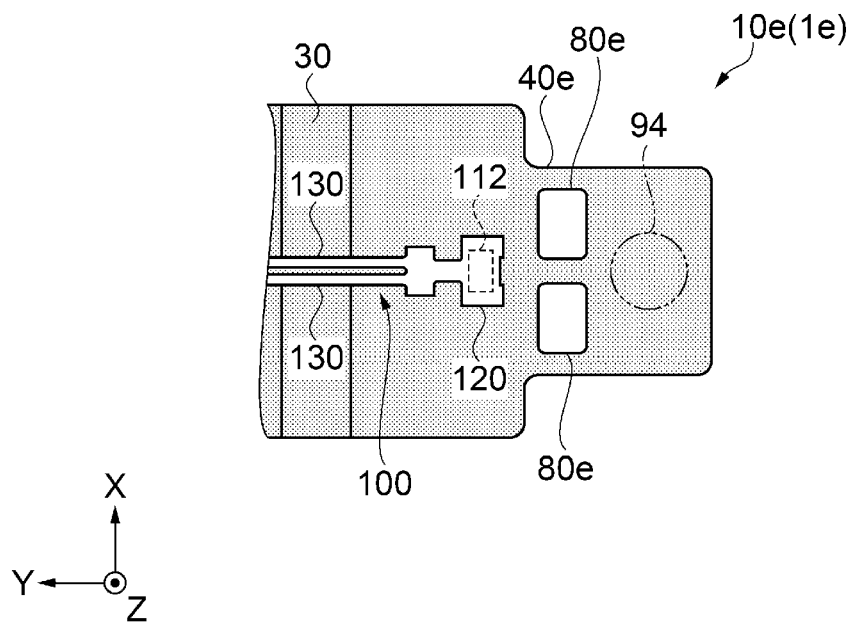
FIG. 10 is a schematic plan view of a movable section of a resonator device according to a sixth embodiment of the invention.

FIG. 10 is a schematic plan view showing the schematic configuration of a movable section of the resonator device according to the sixth embodiment of the invention. Note that components same as those in the embodiments explained above are denoted by the same reference numerals and signs and detailed explanation of the components is omitted.

In FIG. 10, a movable section 40*e* of a base 10*e* according to the sixth embodiment is different from the movable section 40*b* of the base 10*b* explained in the third embodiment in that a stress relaxing section is not one through-hole and is formed by arranging a plurality of through-holes. In the movable section 40*e* in this embodiment, stress relaxing sections 80*e* are a plurality of through-holes and are formed to be arranged in the first direction (the X-axis direction) crossing the direction in which the vibration arms 130 of the resonator element 100 extend. In this embodiment, the stress relaxing sections 80*e*, which are two through-holes, are formed to be arranged. However, not only this, but three or more through-holes may be arranged to form the stress relaxing sections. The stress relaxing sections 80*e* are not limited to the through-holes and may be, for example, a configuration in which a plurality of bottomed grooves like the stress relaxing section 80*a* in the second embodiment are arranged. The stress relaxing sections 80*e* including the plurality of through-holes or bottomed grooves include a form in which an opening is formed by arranging a large number of extremely small through-holes or bottomed grooves.

Note that, in this embodiment in which the plurality of (or the large number of) stress relaxing sections 80*e* are formed to be arranged, to perform stress relaxation in a well-balanced state in the movable section 40*e* of the base 10*e*, it is desirable to dispose the plurality of stress relaxing sections 80*e* symmetrically with respect to a center line of the movable section 40*e* extending along the direction in which the vibration arms 130 of the resonator element 100 extend.

According to the configuration in the sixth embodiment, with the stress relaxing sections 80*e* including the plurality of through-holes (or bottomed grooves) provided between the connection region 94 and the second base section 120, as in the first embodiment, it is possible to make the stress caused by the hardening shrinkage of the joining member much less easily transmitted to the vibration arms 130. It is possible to reduce the influence of the stress. There is an effect that deterioration in the rigidity (strength) of the movable section 40*e* of the base 10*e* is suppressed compared with the stress relaxing section formed by one through-hole.

Seventh Embodiment

Figure 11:
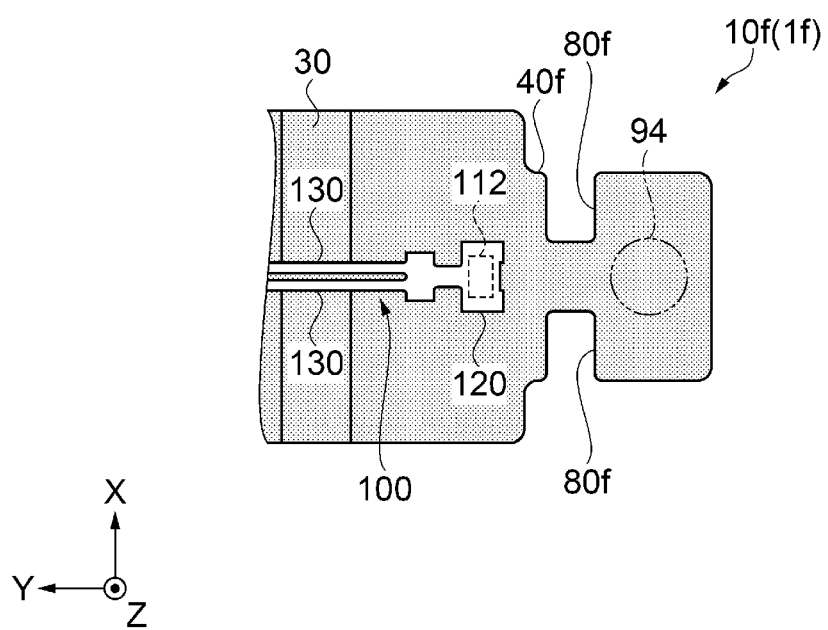
FIG. 11 is a schematic plan view of a movable section of a resonator device according to a seventh embodiment of the invention.

A resonator device 1*f* according to a seventh embodiment of the invention is explained with reference to FIG. 11. FIG. 11 is a schematic plan view of a movable section 40*f* of the resonator device 1*f* according to the seventh embodiment of the invention. Note that components same as those in the embodiments explained above are denoted by the same reference numerals and signs and detailed explanation of the components is omitted.

In the movable section 40f of the base 10f according to the seventh embodiment, stress relaxing sections 80f are two constricted sections formed symmetrically with respect to a center line of the movable section 40f extending along the direction in which the vibration arms 130 of the resonator element 100 extend. That is, the stress relaxing sections 80f constricted in the symmetrical shape are formed between the connection region 94 of the movable section 10f and the joining member 112, which is the connection region, of the second base section 120. Consequently, a narrow portion of the movable section 40f is formed in the center between the stress relaxing sections 80f.

By adopting such a configuration, the base 10f includes, between the connection region 94 and the connection region (the joining member 112) of the second base section 120 to the movable section 40f, the narrow portion of the movable section 40f formed by the two stress relaxing sections 80f. Therefore, it is possible to make the stress caused by the hardening shrinkage of the joining member less easily transmitted to the vibration arms 130. It is possible to further reduce the influence of the stress.

Note that, concerning the shape of the stress relaxing sections 80f, as long as the strength of the movable section 40f can be sufficiently secured, as the length in the first direction (the X-axis direction) crossing the direction in which the vibration arms 130 of the resonator element 100 extend is further increased to the center side and the width of the narrow portion of the movable section 40f between the stress relaxing sections 80f is further narrowed, it is possible to make the stress caused by the hardening shrinkage of the joining member much less easily transmitted to the vibration arms 130.

In the shape of the stress relaxing sections 80f in this embodiment, naturally, the stress relaxing sections 80f may be formed by bottomed grooves like the stress relaxing section 80a in the second embodiment.

Eighth Embodiment

Figure 12:
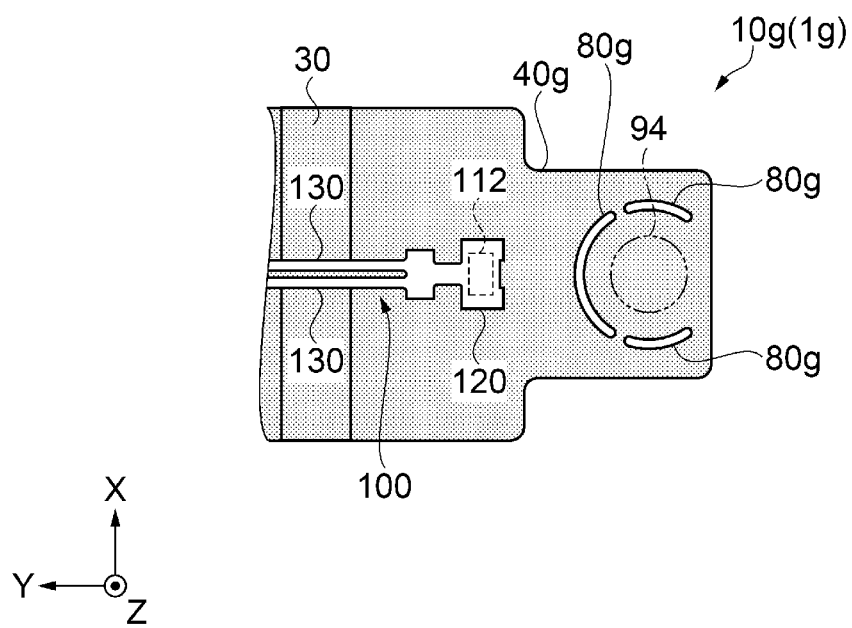
FIG. 12 is a schematic plan view of a movable section of a resonator device according to an eighth embodiment of the invention.

A resonator device 1g according to an eighth embodiment of the invention is explained with reference to FIG. 12. FIG. 12 is a schematic plan view of a movable section 40g of the resonator device 1g according to the eighth embodiment of the invention. Note that components same as those in the embodiments explained above are denoted by the same reference numerals and signs and detailed explanation of the components is omitted.

In the movable section 40g in the eighth embodiment shown in FIG. 12, stress relaxing sections 80g include a plurality of arcuate through-holes and are disposed to surround the connection region 94 on the principal plane of the movable section 40g. In the stress relaxing sections 80g in this embodiment, three through-holes are disposed to surround the connection region 94. However, not only this, but, as long as sufficient strength can be secured, the arcuate holes of the stress relaxing sections 80g may be formed by one arcuate through-hole or may be formed by two or four or more arcuate through-holes. However, the stress relaxing sections 80g are desirably provided to surround the circumferential edge of the connection region 94 as wide as possible in order to reduce propagation routes of stress from the connection region 94 to the vibration arms 130 of the resonator element 100 as much as possible.

As in this embodiment, the stress relaxing sections 80g including the plurality of through-holes are provided to surround the circumferential edge of the connection region 94. Consequently, it is possible to relax stress propagating to the resonator element 100 from directions of the circumferential edge of the connection region 94 of the movable section 40g circling around the connection region 94.

Note that the stress relaxing sections 80g are not limited to the through-holes and may be, for example, a configuration in which a plurality of bottomed arcuate grooves like the stress relaxing section 80a in the second embodiment are arranged. If the stress relaxing sections 80g are formed by the bottomed grooves, the stress relaxing sections 80g can also be one stress relaxing section 80g that surrounds the circumferential edge of the connection region 94 in a shape such as a circular shape or a polygonal shape.

Modification of the Eighth Embodiment

Figure 13:
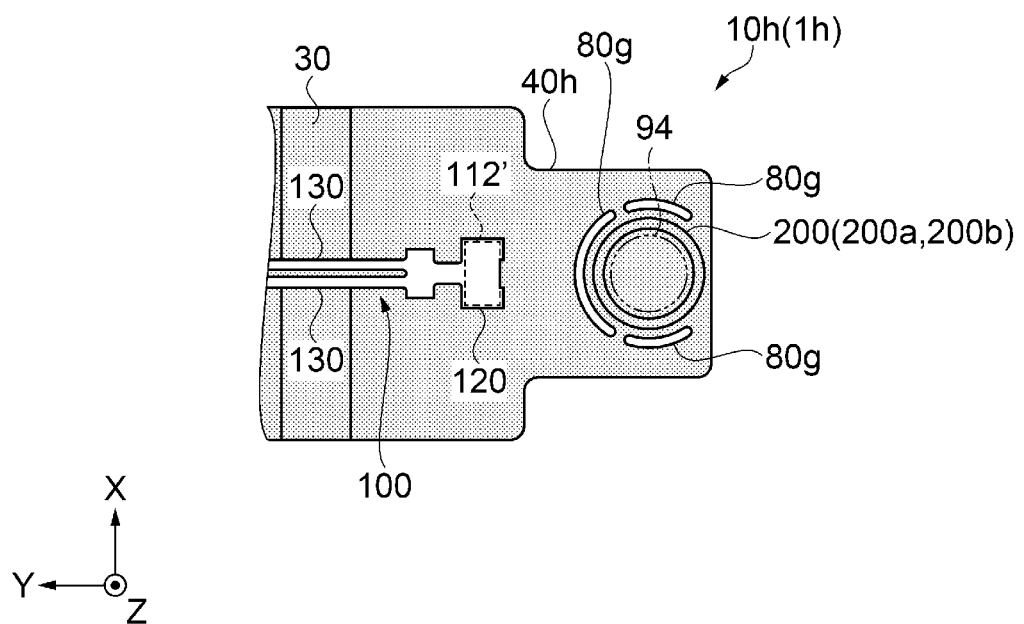
FIG. 13 is a schematic plan view of a movable section of a resonator device according to a modification of the eighth embodiment of the invention.

A resonator device 1h according to a modification of the eighth embodiment is explained with reference to FIG. 13. FIG. 13 is a schematic plan view of a movable section 40h of the resonator device 1h according to the modification of the eighth embodiment. Note that components same as those in the eighth embodiment are denoted by the same reference numerals and signs and detailed explanation of the components is omitted.

As shown in FIG. 13, the resonator device 1h according to the modification of the eighth embodiment includes, in the movable section 40h thereof, the stress relaxing sections 80g same as those in the seventh embodiment and the protrusion section 200 (200a, 200b) same as that in the fifth embodiment and the modification 1 and the modification 2 of the fifth embodiment. In FIG. 13, the protrusion section 200 having a shape same as the shape in the fifth embodiment is shown. However, the protrusion section 200 may be the protrusion section 200a (see FIG. 8) having the shape in the modification 1 of the fifth embodiment or the protrusion section 200b (FIG. 9) having the shape in the modification 2 of the fifth embodiment.

In the movable section 40h, the protrusion section 200 (200a, 200b) is disposed to surround the connection region 94. The stress relaxing sections 80g are disposed to surround the protrusion section 200 (200a, 200b).

Note that, in FIG. 13, a joining member 112' for joining the second base section 120 of the resonator element 100 to the movable section 40h is joined in a region larger than the joining member 112 in the embodiments and the modifications in plan view. This is desirable because joining strength of the resonator element 100 to the movable section 40h is secured. The joining member 112' can also be caused to function as a stress relaxing section. For example, by using a material having relatively high elasticity in a solidified state as the joining member 112', it is possible to cause the joining member 112' to function as a stress relaxing section that suppresses propagation of stress from the connection region 94 to the vibration arms 130 of the resonator element 100.

By dividing the joining member 112' into a plurality of joining members, disposing the divided joining members via gaps, and joining the movable section 40f and the resonator element 100 (the second base section 120), it is possible to cause the joining members as stress relaxing sections that suppress propagation of stress from the connection region 94 to the vibration arms 130 of the resonator element 100.

As explained above, by adopting the configuration in this modification, it is possible to suppress, with the stress relaxing sections 80g, propagation of stress from the connection region 94 to the vibration arms 130 of the resonator element 100. As in the fifth embodiment, it is possible to prevent the joining member from protruding from the connection region 94. It is possible to keep a joining area of the joining region 94 fixed. Therefore, it is possible to reduce stress fluctuation and joining strength fluctuation involved in the hardening shrinkage of the joining member due to size fluctuation of the connection area.

EXAMPLES

Examples including the resonator device 1 according to an embodiment of the invention are explained with reference to FIGS. 14 to 17.

Electronic Apparatus

First, an electronic apparatus including the resonator device 1 according to the embodiment of the invention is explained in detail with reference to FIGS. 14 to 16.

Figure 14:
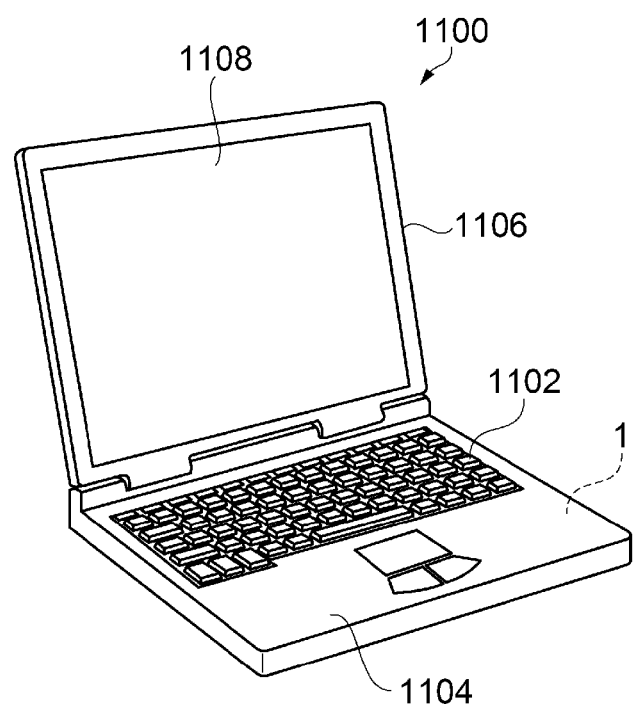
FIG. 14 is a perspective view showing the configuration of a mobile (or notebook) personal computer functioning as an electronic apparatus including a resonator device according to an embodiment of the invention.

FIG. 14 is a perspective view showing the schematic configuration of a notebook (or mobile) personal computer functioning as the electronic apparatus including the resonator device according to the embodiment of the invention. In the figure, a notebook personal computer 1100 includes a main body section 1104 including a keyboard 1102 and a display unit 1106 including a display section 1108. The display unit 1106 is turnably supported with respect to the main body section 1104 via a hinge structure section. The resonator device 1 functioning as an inclination sensor or the like for detecting opening and closing of the display unit 1106 and detecting an angle of the opening and closing is incorporated in the notebook personal computer 1100.

Figure 15:
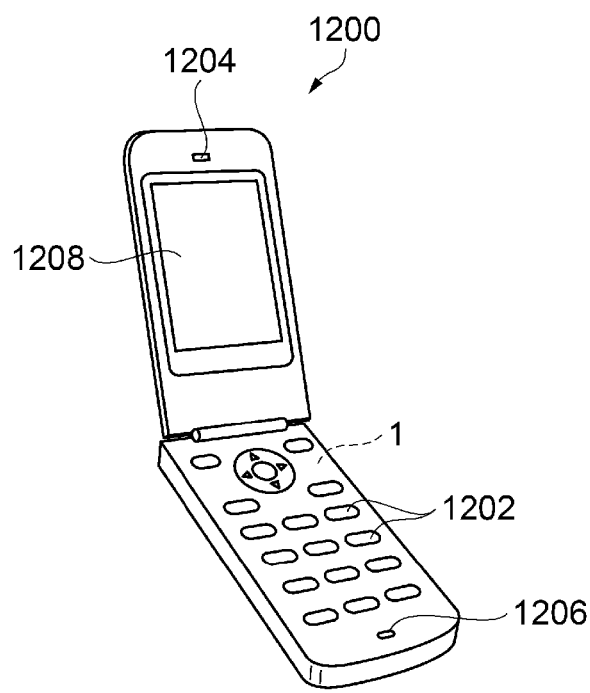
FIG. 15 is a perspective view showing the configuration of a cellular phone (including a PHS) functioning as the electronic apparatus including the resonator device according to the embodiment of the invention.

FIG. 15 is a perspective view showing the schematic configuration of a cellular phone (including a PHS) functioning as the electronic apparatus including the resonator device according to the embodiment of the invention. In the figure, a cellular phone 1200 includes a plurality of operation buttons 1202, an earpiece 1202, and a mouthpiece 1206. A display section 1208 is disposed between the operation buttons 1202 and the earpiece 1204. In order to determine a display direction of an image or the like displayed on the display section 1208, the resonator device 1 functioning as a sensor for detecting the inclination of the display section 1208 is incorporated in the cellular phone 1200.

Figure 16:
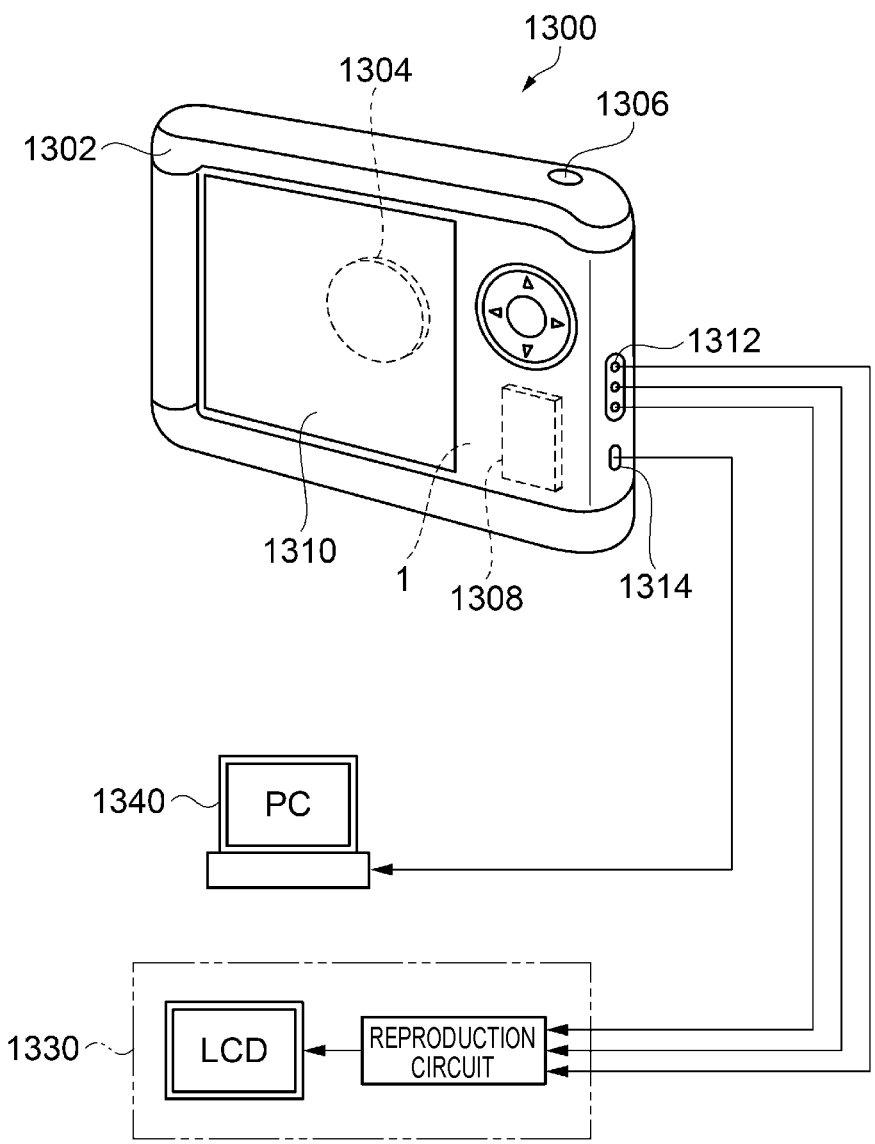
FIG. 16 is a perspective view showing the configuration of a digital still camera functioning as the electronic apparatus including the resonator device according to the embodiment of the invention.

FIG. 16 is a perspective view showing the schematic configuration of a digital still camera functioning as the electronic device including the resonator device according to the embodiment of the invention. Note that, in the figure, connection to external apparatuses are also simply shown. Whereas a normal camera exposes a silver halide photographic film with an image light of an object, a digital still camera 1300 photoelectrically converts the light image of the object with an image pickup device such as a CCD (Charge Coupled Device) to generate an image pickup signal (an image signal).

A display section 1310 is provided on the rear surface of a case (a body) 1302 in the digital still camera 1300 to perform display on the basis of the image pickup signal generated by the CCD. The display section 1310 functions as a finder that displays the object as an electronic image. On the front side (the rear side in the figure) of the case 1302, a light receiving unit 1304 including an optical lens (an image pickup optical system) and the CCD is provided.

When a photographer checks the object image displayed on the display section 1310 and depresses a shutter button 1306, an image pickup signal of the CCD at that point is transferred to and stored in a memory 1308. In the digital still camera 1300, a video-signal output terminal 1312 and an input/output terminal 1314 for data communication are provided on a side surface of the case 1302. As shown in the figure, a television monitor 1330 is connected to the video-signal output terminal 1312 and a personal computer 1340 is connected to the input/output terminal 1314 for data communication according to necessity. Further, according to predetermined operation, the image pickup signal stored in the memory 1308 is output to the television monitor 1330 and the personal computer 1340. In the digital still camera 1300, in order to horizontally photograph the object image, the resonator device 1 functioning as an inclination sensor or the like for informing the photographer of the inclination of the digital still camera 1300 is incorporated.

Note that the resonator device 1 according to the embodiment of the invention can be applied to, besides the personal computer 1100 (the mobile personal computer) shown in FIG. 14, the cellular phone 1200 shown in FIG. 15, and the digital still camera 1300 shown in FIG. 16, electronic apparatuses such as, for example, an inkjet-type discharge apparatus (e.g., an inkjet printer), a television, a video camera, a video tape recorder, a car navigation apparatus, a pager, an electronic notebook (including an electronic notebook with a communication function), an electronic dictionary, an electronic calculator, an electronic game machine, a word processor, a work station, a video phone, a security television monitor, an electronic binocular, a POS terminal, medical apparatuses (e.g., an electronic thermometer, a blood manometer, a blood sugar meter, an electrocardiogram apparatus, an ultrasonic diagnostic apparatus, and an electronic endoscope), a fish finder, various measuring apparatuses, meters (e.g., meters for a vehicle, an airplane, and a ship), and a flight simulator.

Moving Object

Figure 17:
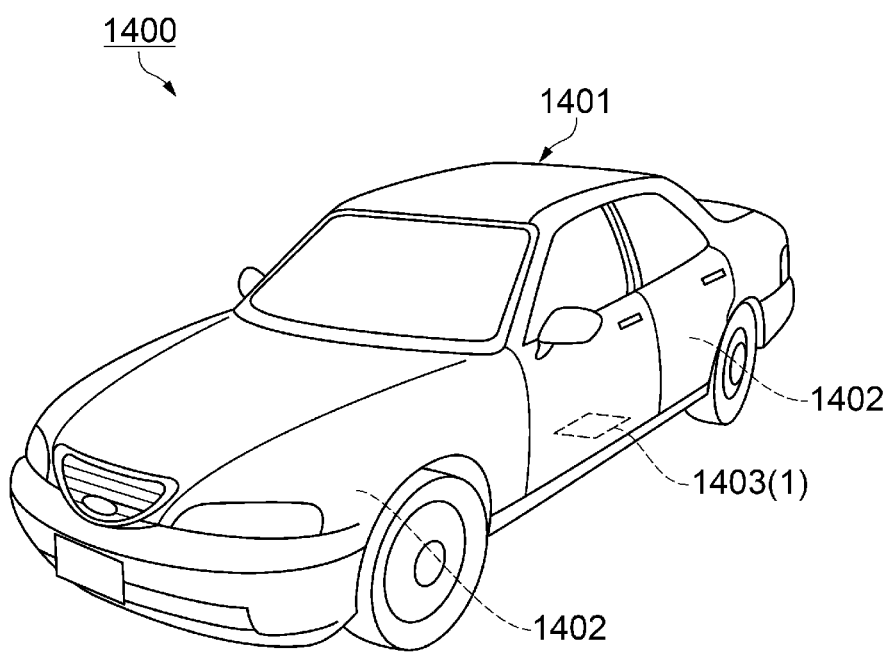
FIG. 17 is a perspective view schematically showing an automobile as an example of a moving object including the resonator device according to the embodiment of the invention.

FIG. 17 is a perspective view schematically showing an automobile as an example of a moving object. The resonator device 1 according to the invention is mounted on an automobile 1400. For example, as shown in the figure, in the automobile 1400 functioning as the moving object, an electronic control unit 1403 incorporating the resonator device 1, which detects the inclination of the automobile 1400, to drive a suspension 1402 and control the posture of a vehicle body is mounted on a vehicle body 1401. Besides, the resonator device 1 can be widely applied to electronic control units (ECUs) such as an antilock brake system (ABS), an air bag, a tire pressure monitoring system (TPMS), and engine control.

The resonator device 1 (1*a*, 1*b*, 1*c*, 1*d*, 1*d*1, 1*d*2, 1*e*, 1*f*, 1*g*, and 1*h*), the electronic apparatus, and the moving object according to the embodiments of the invention are explained above on the basis of the embodiments shown in the figures. However, the invention is not limited to this. The components of the sections can be replaced with any components having similar functions. Any other components may be added to the invention. The embodiments may be combined as appropriate.

For example, in the embodiments and the modifications, the configuration in which the stress relaxing section is provided in the movable section of the resonator device is explained. The configuration in which the joining member 112 for joining the resonator element 100 onto the movable section 40 is the stress relaxing section is explained. Not only this, but the stress relaxing section only has to function in order to suppress propagation of stress from the connection region 94 of the movable section to the vibration arms 130 of the resonator element 100. For example, if a slit, a small hole, a bottomed groove, a constriction (a narrow portion), or the like is provided in a region from the base section (the second base section 120, the first base section 110) of the resonator element 100 to the vibration arms 130, it is possible to suppress propagation of stress from the connection region 94 to the vibration arms 130.

The entire disclosure of Japanese Patent Application Nos. 2014-187356, filed Sep. 16, 2014 and 2015-149338, filed Jul. 29, 2015 are expressly incorporated by reference herein.

What is claimed is:

1. A resonator device comprising:
   a base including a fixed section and a movable section connected to the fixed section;
   a resonator element including a first base section, a second base section, and a vibration arm, one end of which is connected to the first base section and the other end of which is connected to the second base section, the first base section being fixed to the fixed section and the second base section being fixed to the movable section;
   a weight section connected onto the movable section; and
   a stress relaxing section provided between a connection region of the weight section and the vibration arm.

2. The resonator device according to claim 1, wherein the stress relaxing section is at least one of a groove and a through-hole.

3. An electronic apparatus comprising the resonator device according to claim 2.

4. A moving object comprising the resonator device according to claim 2.

5. The resonator device according to claim 1, wherein the stress relaxing section is provided on the base.

6. The resonator device according to claim 5, wherein the stress relaxing section is provided around the second base section.

7. An electronic apparatus comprising the resonator device according to claim 6.

8. A moving object comprising the resonator device according to claim 6.

9. An electronic apparatus comprising the resonator device according to claim 5.

10. A moving object comprising the resonator device according to claim 5.

11. The resonator device according to claim 1, wherein, when a direction orthogonal to a direction in which the vibration arm extends is represented as a first direction, length in the first direction of the stress relaxing section is larger than length in the first direction of the second base section.

12. An electronic apparatus comprising the resonator device according to claim 11.

13. A moving object comprising the resonator device according to claim 11.

14. An electronic apparatus comprising the resonator device according to claim 1.

15. A moving object comprising the resonator device according to claim 1.

* * * * *